United States Patent
Schaefer et al.

(10) Patent No.: US 11,619,764 B2
(45) Date of Patent: Apr. 4, 2023

(54) HIGH-PERFORMANCE OPTICAL SURFACE

(71) Applicant: RAYTHEON COMPANY, Waltham, MA (US)

(72) Inventors: John P. Schaefer, Plano, TX (US); Paul J. Gasloli, Richardson, TX (US)

(73) Assignee: RAYTHEON COMPANY, Waltham, MA (US)

( * ) Notice: Subject to any disclaimer, the term of this patent is extended or adjusted under 35 U.S.C. 154(b) by 351 days.

(21) Appl. No.: 16/832,974

(22) Filed: Mar. 27, 2020

(65) Prior Publication Data
US 2021/0302626 A1 Sep. 30, 2021

(51) Int. Cl.
*G02B 1/11* (2015.01)
*C23C 14/06* (2006.01)
*C23C 14/18* (2006.01)
*C23C 14/24* (2006.01)
*G02B 1/113* (2015.01)

(52) U.S. Cl.
CPC ............ *G02B 1/11* (2013.01); *C23C 14/0629* (2013.01); *C23C 14/18* (2013.01); *C23C 14/24* (2013.01); *G02B 1/113* (2013.01)

(58) Field of Classification Search
CPC .. G02B 1/11; G02B 1/113; G02B 1/14; G02B 3/0025; G02B 5/281; G02B 1/115; G02B 3/00; G02B 5/28; C23C 14/0629; C23C 14/18; C23C 14/24; C23C 14/06
See application file for complete search history.

(56) References Cited

U.S. PATENT DOCUMENTS

| | | | | |
|---|---|---|---|---|
| 5,903,005 A | * | 5/1999 | Smith | G02B 13/14 348/E3.01 |
| 5,935,723 A | * | 8/1999 | Borden | G02B 1/115 359/359 |
| 5,993,981 A | | 11/1999 | Askinazi et al. | |
| 6,038,065 A | * | 3/2000 | Borden | G02B 1/11 359/359 |
| 6,339,605 B1 | * | 1/2002 | Vetrovec | H01S 3/0606 359/333 |

(Continued)

FOREIGN PATENT DOCUMENTS

EP    1 597 614 A1    11/2005

OTHER PUBLICATIONS

International Search Report for corresponding International Application No. PCT/US2020/053639, filed Sep. 30, 2020, International Search Report dated Dec. 21, 2020 and mailed Jan. 14, 2021 (5 pgs.).

(Continued)

*Primary Examiner* — Balram T Parbadia
(74) *Attorney, Agent, or Firm* — Lewis Roca Rothgerber Christie LLP

(57) ABSTRACT

A high-performance optical surface includes: a substrate having a first surface and a second surface opposite to the first surface; a first anti-reflection (A/R) coating formed on the second surface of the substrate; a coated layer formed over the A/R coating on a surface of the A/R coating opposite to the stress compensation layer, where a surface of the coating layer opposite to the first A/R coating is diamond point turned or polished to improve finish; and a second A/R coating formed on the polished surface of the coating layer to formed the high-performance reflective surface.

14 Claims, 2 Drawing Sheets

(56) References Cited

U.S. PATENT DOCUMENTS

| | | | |
|---|---|---|---|
| 6,596,982 B1* | 7/2003 | Skokan | G02B 1/11 |
| | | | 359/371 |
| 6,921,177 B2 | 7/2005 | Schaefer | |
| 8,259,291 B2* | 9/2012 | Taylor | F41G 7/008 |
| | | | 356/3.01 |
| 10,214,446 B2 | 2/2019 | Broadway et al. | |
| 10,948,628 B1* | 3/2021 | Demiryont | G02F 1/155 |
| 2009/0308446 A1 | 12/2009 | Lin et al. | |
| 2012/0044473 A1* | 2/2012 | Lippert | G03F 7/7015 |
| | | | 359/359 |
| 2013/0170056 A1 | 7/2013 | Ekstein et al. | |
| 2018/0024276 A1* | 1/2018 | Wang | G02B 1/14 |
| | | | 359/601 |
| 2018/0136370 A1* | 5/2018 | Busse | H01S 1/06 |
| 2018/0231698 A1* | 8/2018 | Sutherland | G02B 1/04 |
| 2020/0241174 A1* | 7/2020 | Fromentin | B29D 11/00865 |

OTHER PUBLICATIONS

Written Opinion of the International Searching Authority for corresponding International Application No. PCT/US2020/053639, filed Sep. 30, 2020, Written Opinion of the International Searching Authority dated Jan. 14, 2021 (7 pgs.).

* cited by examiner

HIGH-PERFORMANCE OPTICAL SURFACE

FIELD OF THE INVENTION

The disclosed invention generally relates to high-performance optical surfaces, and more specifically to optical finishing of transmissive surfaces such as lenses.

BACKGROUND

A typical technique for making precision infrared optics and metal mirrors is to take a substrate of an aluminum alloy, or infrared material, and to carry out single point diamond turning of a surface on the substrate, which then serves as the optical surface, which can be either reflective or refractive. Diamond turning or single point diamond turning (DPT) is turning with diamond as the cutting tool for high-quality aspheric optical elements from crystals, metals, acrylic, and other materials. DPT is a process of mechanical machining of precision elements using special machine tools (e.g., CNC lathes or flycutters equipped with natural or synthetic single-crystal diamond-tipped tool bits, Optical elements produced by single point diamond turning are used in optical assemblies in telescopes, missile guidance systems, lasers, scientific research instruments, and numerous other systems and devices.

Often times the substrates selected by the optical designer, which produces the best optical performance, may not be the best material for DPT. Some materials like silicon, create excessive tool wear which produces less than desirable surface finish results. Other material such as Zinc Sulfide (ZnS), Zinc Selenide (ZnSe), and Sulfide Multispectral (ZnS M/S), are granular in nature and the resulting surface finish created by the DPT process is also less than desirable and creates optical scatter. F Furthermore, advanced optical surfaces may have diffraction gratings embedded into the optical surface in order to correct color dispersion. In these cases, the material issues described above make it difficult to create accurate grating features due to tool wear, and or, the granular nature of the material itself. To overcome these limitations, the present disclosure describes a process technique that provides a more desirable intermediary optical material for diamond turning. This technique provides superior overall optical performance.

SUMMARY

In some embodiments, the disclosed invention is an apparatus with a high-performance optical surface. The apparatus includes a substrate having a first surface and a second surface opposite to the first surface; a first anti-reflection (A/R) coating; a coated layer formed over the A/R coating on a surface of the A/R coating opposite to the stress compensation layer, wherein a surface of the coating layer opposite to the first A/R coating is diamond point turned or polished to improve finish; and a second A/R coating formed on the polished surface of the coating layer to formed the high-performance reflective surface.

In some embodiments, the disclosed invention is a method for manufacturing a high-performance optical surface. The method includes: forming an optical substrate; shaping and fine grounding the substrate; pre-finishing an optical surface of the substrate; forming a thin film first anti-reflection (AR) layer on the pre-finished optical surface of the substrate; depositing a Zinc sulfide or Germanium coated layer on the anti-reflection layer; finishing a surface of the coated layer opposite to the AR layer; and depositing a second anti-reflection on the finished surface of the coated layer to form the high-performance optical surface.

The apparatus may also include a third A/R coating on the first surface of the substrate to reduce internal reflection between the substrate and air. The apparatus may also include a stress compensation layer formed on the second surface of the substrate between the substrate and the first A/R coating. In some embodiments, the substrate is a bulk silicon. The substrate material may be Zinc Selenide (ZnSe), Zinc sulfide (ZnS), or Zinc sulfide (ZnS) Multispectral or any other suitable optical material. In some embodiments, the stress compensation layer, the first A/R coating and the coated layer are all formed in a same thin-film vapor deposition process.

BRIEF DESCRIPTION OF THE DRAWINGS

A more complete appreciation of the disclosed invention, and many of the attendant features and aspects thereof, will become more readily apparent as the disclosed invention becomes better understood by reference to the following detailed description when considered in conjunction with the accompanying drawings in which like reference symbols indicate like components.

DETAILED DESCRIPTION

In some embodiments, the disclosed invention enables a higher performance optical surface and a method of manufacturing same that provides a more desirable surface for diamond point turning by depositing a softer amorphous layer of material, for example, Zinc sulfide (ZnS), Germanium (Ge), Zinc selenide (ZnSe), Magnesium Fluoride (MgF2), and/or similar material. In some embodiments, the manufacturing method uses vacuum deposition techniques with diamond point turning (DPT), which results in a much better surface finish than achievable with the underlying substrate material. In some embodiments, the disclosed invention resolves surface finish issues caused by rapid tool wear, such as, with Silicon substrates, and in other cases, it is used to overcome surface finish issues caused by the inherent structure of the substrate material, which limits achievable surface finish. In some embodiments, Zinc selenide (ZnSe) or ZnS Multispectral (ZnS M/S) may be used as an outside layer for the DPT to improve finish, or for a grating surface for spectroscopic applications. In some embodiments, additional layers can be added to the coating stack to compensate for stress build up in the thick coating layer and to reduce internal reflections and to maintain transmission.

Figure 1:
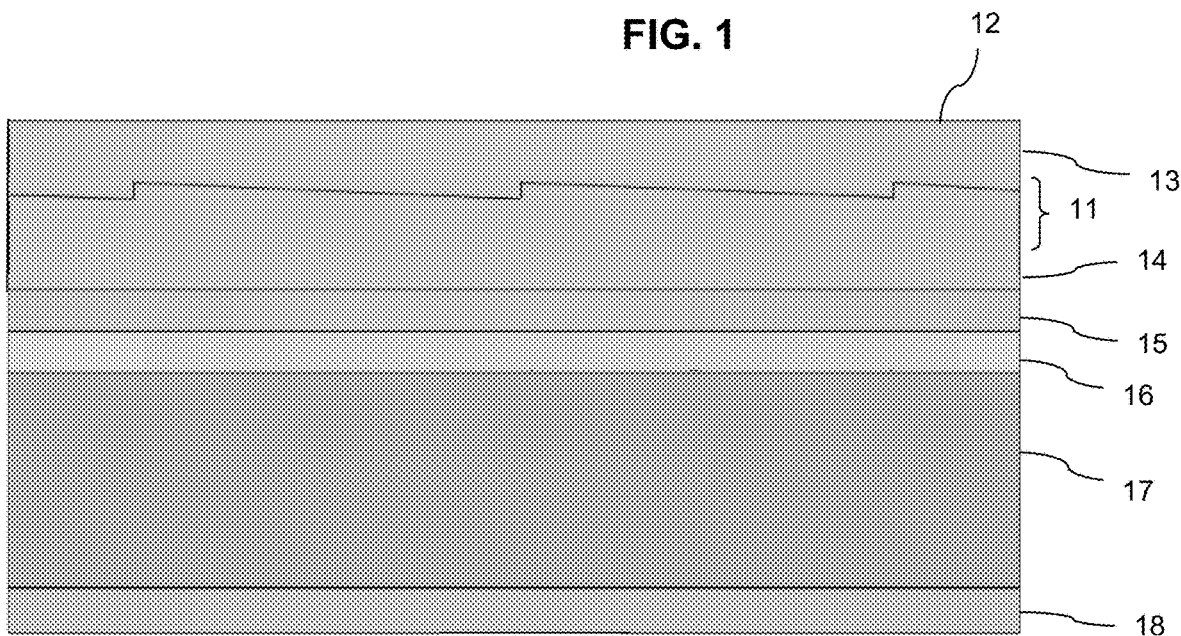
FIG. 1 is a sectional view of an exemplary high-performance optic, according to some embodiments of the disclosed invention.

FIG. 1 is a sectional view of a high-performance optic 12, according to some embodiments of the disclosed invention. Optic 12 has a substrate 17, for example, bulk silicon. However, the substrate 17 can be made from any other suitable material, such as, Germanium, ZnS, ZnSe, or ZnS M/S.

Optionally, a stress compensation layer 16 is then formed on top of the substrate 17. In some embodiments, the stress compensation layer 16 is formed on the pre-finished optical surface, for example, by a thin-film deposition process. An anti-reflection (A/R) coating 15 is formed on top of the substrate 17 (or, the stress compensation layer 16) to reduce internal reflection between the substrate 17 (or, the stress compensation layer 16) and a coated layer 11, thus improving optical transmission. An adequately thick coated layer 11 is deposited over the A/R coating 15. In some embodiments, the adequately thick coated layer 11 is ZnS, Germanium, ZnSe, or any other suitable optical material.

In some embodiments, the thick coated layer 11 is then DPT'd to improve finish and figure, resulting in a thinner (e.g., 12 um) thick grating layer 14. A final A/R layer 13 and 18 is then deposited on top of the grating layer 14 and on the opposite side of the substrate 17, for outside anti-reflection to form the final high-performance optic 12. In some embodiments, the first A/R coating and the thick coated layer (and optional stress compensation layer 16) are deposited in same (thin-film vapor deposition) operation.

In some embodiments, the adequately thick coated layer 11 is formed from ZnS, Germanium, ZnSe, or any other suitable thin-film material. In some embodiments, the adequately thick coated layer 11 is finished by a Magneto-rheological Finishing (MRF) process and is not a grating surface, but may be a spherical surface, a flat surface, or an aspheric surface. MRF is a precision surface finishing technology, wherein optical surfaces are polished in a computer-controlled magnetorheological (MR) finishing slurry. Unlike conventional rigid lap polishing, the MR fluid's shape and stiffness can be magnetically manipulated and controlled in real time, for example, by a computer-controlled system. In some embodiments, the adequately thick coated layer 11 is finished by a computer numerical control (CNC) polishing.

Figure 2:
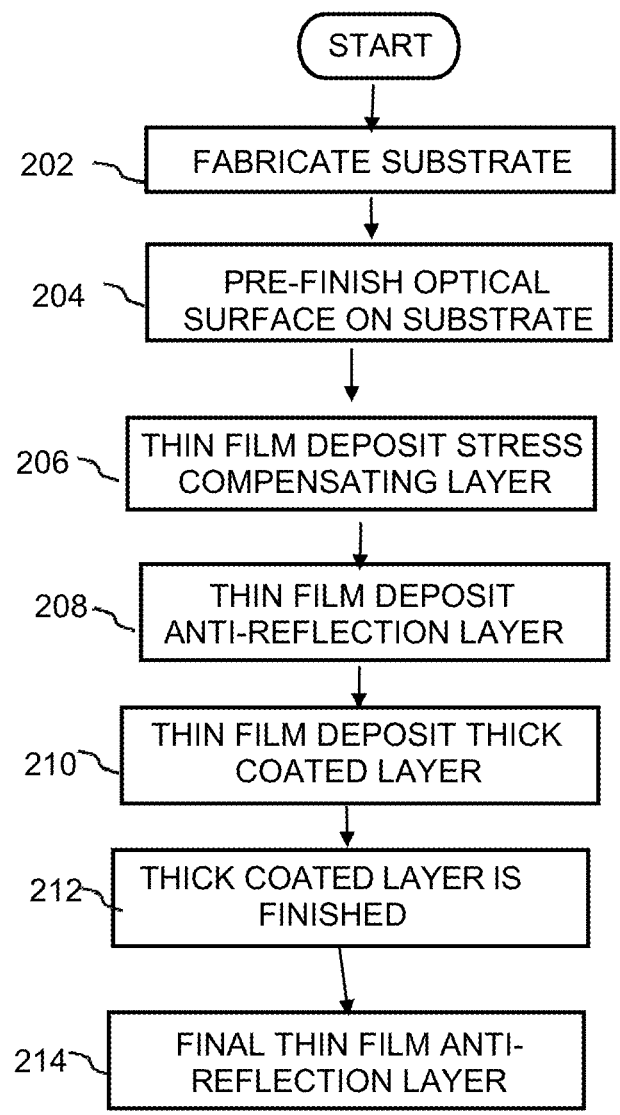
FIG. 2 is a process flow diagram for producing a high-performance optic, according to some embodiments of the disclosed invention.

FIG. 2 is a process flow diagram for producing the high-performance optic shown in FIG. 1. As shown in block 202, an optical substrate is fabricated. The optical substrate, which may be made of silicon, but could be made of any other IR material, is shaped and fine grounded, using various known optical manufacturing methods. This process step takes the substrate from a block of material (e.g., silicon) down to final physical dimensions in preparation for final polishing or finishing.

The optical surface of the shaped substrate is then pre-finished in block 204. For example, the optical surface of the shaped substrate is diamond point turned with less than desirable surface finish due to limitations of the optical substrate material such as hardness, or grain structure. This way, the overall shape of the optical surface is formed close to final requirements, but leaves an inadequate surface finish. In some embodiments, conventional polishing methods are used to pre-finish the substrate.

In optional block 206, a stress compensating layer (e.g., layer 16 in FIG. 1) is optionally formed on the pre-finished optical surface of the shaped substrate. In some embodiments, the pre-finished optical surface of the shaped substrate is deposited with the optional stress compensating layer, using known thin-film vapor deposition processes. This coating layer counteracts the undesirable bending stress build up in the thick coated layer (formed in block 210). In block 208, a thin film deposit anti-reflection (AR) layer (e.g., layer 15 in FIG. 1) is formed on the substrate (or the stress compensating layer), using known thin-film vapor deposition processes. In some embodiments, the material for the AR layer is selected to reduce internal reflections between the substrate (or the stress compensating layer) and the thick coated layer (formed in block 210) using AR materials are common to those typically used in the art.

In block 210, the coating layer is deposited with an adequately thick thin-film vapor deposition process to form a thick (Zinc sulfide or Germanium) coated layer (e.g., layer 11 in FIG. 1). In some embodiments, the stress compensating layer, the AR layer and the thick coated layer are all deposited in the same thin-film vapor deposition process run. The adequately thick coated layer is a more desirable material for diamond point turning since it is amorphous and softer which creates less tool wear and produces better surface finishes. This coating process prepares the surface for the next DPT process. In block 212, the adequately thick coated layer is then finished, for example, by DPT, MRF, or conventional polishing process. In block 214, the finished surface of the adequately thick coated layer is deposited with an anti-reflection thin-film vapor deposition of a type known in the art. The anti-reflection thin-film is selected to reduce internal reflections between its adjacent layers and air to improve optical transmission. This novel process enables the fabricator to achieve the intended optical performance specified by an optical designer, when using a less than desirable substrate material in terms of optical fabrication. The process produces high-fidelity gratings with a high diffraction efficiency, excellent surface finish properties for reduced scatter, surface figure for improved imaging, and with embedded and external AR coatings for maximum optical transmission.

The high-performance optics of the disclosed invention may be used in optical assemblies in telescopes, video projectors, missile guidance systems, laser systems, scientific research instruments, and other optical systems and devices to further enhance their performance.

It will be recognized by those skilled in the art that various modifications may be made to the illustrated and other embodiments of the invention described above, without departing from the broad inventive step thereof. It will be understood therefore that the invention is not limited to the particular embodiments or arrangements disclosed, but is rather intended to cover any changes, adaptations or modifications which are within the scope of the invention as defined by the appended drawings and claims.

What is claimed is:

1. An apparatus with a high-performance optical surface comprising:
   a substrate having a first surface and a second surface opposite to the first surface;
   a stress compensation layer formed on the second surface of the substrate;
   a first anti-reflection (A/R) coating;
   a coated layer formed over the A/R coating on a surface of the A/R coating opposite to the stress compensation layer, wherein a surface of the coated opposite to the first A/R coating is diamond point turned to form a grating layer to improve finish; and
   a second A/R coating formed on the grating layer to form the high-performance optical surface.

2. The apparatus of claim 1, further comprising a third A/R coating on the first surface of the substrate to reduce internal reflection between the substrate and air.

3. The apparatus of claim 1, wherein the substrate is a bulk silicon.

4. The apparatus of claim 1, wherein the substrate material is Zinc Selenide (ZnSe), or Zinc sulfide (ZnS).

5. The apparatus of claim 1, wherein the substrate material is Zinc sulfide (ZnS) Multispectral.

6. The apparatus of claim 1, wherein the stress compensation layer, the first A/R coating and the coated layer are all formed in a same thin-film vapor deposition process.

7. The apparatus of claim 1, wherein the coated layer is made of Zinc sulfide (ZnS), Germanium (Ge), or Zinc Selenide (ZnSe).

8. The apparatus of claim 1, wherein the high-performance optical surface is aspheric.

9. The apparatus of claim 1, wherein the coated layer is finished by a Magnetorheological Finishing (MRF) process.

10. The apparatus of claim 1, wherein the coated layer is finished by computer numerical control (CNC) polishing.

11. The apparatus of claim 1, wherein the coated layer is finished by a diamond point turned process.

12. A telescope comprising the apparatus of claim 1.

13. A missile guidance system comprising the apparatus of claim 1.

14. A laser system comprising the apparatus of claim 1.

* * * * *